United States Patent
Mauder et al.

(10) Patent No.: US 9,048,095 B2
(45) Date of Patent: Jun. 2, 2015

(54) METHOD FOR MANUFACTURING A SEMICONDUCTOR DEVICE HAVING A CHANNEL REGION IN A TRENCH

(71) Applicant: Infineon Technologies AG, Neubiberg (DE)

(72) Inventors: Anton Mauder, Kolbermoor (DE); Franz Hirler, Isen (DE); Hans Peter Felsl, Munich (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/470,996

(22) Filed: Aug. 28, 2014

(65) Prior Publication Data
US 2014/0370693 A1   Dec. 18, 2014

Related U.S. Application Data

(62) Division of application No. 13/227,206, filed on Sep. 7, 2011, now Pat. No. 8,860,025.

(51) Int. Cl.
| | |
|---|---|
| H01L 21/02 | (2006.01) |
| H01L 21/302 | (2006.01) |
| H01L 29/66 | (2006.01) |
| H01L 29/78 | (2006.01) |
| H01L 29/861 | (2006.01) |
| H01L 29/10 | (2006.01) |
| H01L 29/36 | (2006.01) |
| H01L 29/423 | (2006.01) |
| H01L 29/06 | (2006.01) |

(52) U.S. Cl.
CPC ....... *H01L 21/02576* (2013.01); *H01L 29/4236* (2013.01); *H01L 29/6609* (2013.01); *H01L 29/7803* (2013.01); *H01L 29/7813* (2013.01); *H01L 29/861* (2013.01); *H01L 29/0626* (2013.01); *H01L 29/0692* (2013.01); *H01L 29/1095* (2013.01); *H01L 21/302* (2013.01); *H01L 29/36* (2013.01); *H01L 29/66136* (2013.01)

(58) Field of Classification Search
CPC ..................... H01L 21/0262; H01L 21/02532; H01L 21/02381; H01L 21/0254
USPC ......................................................... 438/138
See application file for complete search history.

(56) References Cited

U.S. PATENT DOCUMENTS

| | | | |
|---|---|---|---|
| 6,979,861 B2 | 12/2005 | Rodov et al. | |
| 7,816,210 B2 | 10/2010 | Poelzl et al. | |
| 2003/0224588 A1* | 12/2003 | Yamauchi et al. | 438/524 |
| 2008/0121993 A1 | 5/2008 | Hefner | |

FOREIGN PATENT DOCUMENTS

DE   102009047808 A1   5/2011

* cited by examiner

*Primary Examiner* — Monica D Harrison
(74) *Attorney, Agent, or Firm* — Murphy, Bilak & Homiller, PLLC

(57) ABSTRACT

A method of manufacturing a semiconductor device includes forming a semiconductor diode by forming a drift region, forming a first semiconductor region of a first conductivity type in or on the drift region and electrically coupling the first semiconductor region to a first terminal via a first surface of a semiconductor body, etching a trench into the semiconductor body, and forming a channel region of a second conductivity type in the trench and electrically coupling the channel region to the first terminal via the first surface of the semiconductor body. A first side of the channel region adjoins the first semiconductor region.

9 Claims, 8 Drawing Sheets

METHOD FOR MANUFACTURING A SEMICONDUCTOR DEVICE HAVING A CHANNEL REGION IN A TRENCH

PRIORITY CLAIM

This application is a Divisional of U.S. application Ser. No. 13/227,206, filed on 7 Sep. 2011, the content of said application incorporated herein by reference in its entirety.

BACKGROUND

Semiconductor devices such as field effect transistors (FETs) or diodes are used for various applications. These semiconductor devices are typically required to meet specific demands on characteristics such as the capability to carry surge currents and soft switching.

Since characteristics such as surge current capability and switching behaviour are influenced by an excess charge carrier distribution of electrons and holes within the device, it is desirable to better adapt the access charge carrier distribution to different operation modes within the device so as to improve characteristics such as surge current capability and soft switching behaviour.

SUMMARY

According to one embodiment of a semiconductor device, the semiconductor device includes a semiconductor diode. The semiconductor diode includes a drift region and a first semiconductor region formed in or on the drift region. The first semiconductor region is electrically coupled to a first terminal via a first surface of a semiconductor body. The semiconductor diode further includes a channel region of a second conductivity type electrically coupled to the first terminal. A bottom of the channel region adjoins the first semiconductor region. A first side of the channel region adjoins the first semiconductor region.

According to another embodiment of a semiconductor device, the semiconductor device includes a drift region and a first semiconductor region in or on the drift region. The first semiconductor region is electrically coupled to a first terminal via a first surface of a semiconductor body. The semiconductor device further includes a first trench extending into the first semiconductor region from the first surface. The first trench includes an electrode electrically coupled to the first semiconductor region and the first trench further includes a dielectric layer between the electrode and the first semiconductor region. A bottom of the first trench adjoins the first semiconductor region.

According to an embodiment of a method of manufacturing a semiconductor device, the method includes forming a semiconductor diode by forming a drift region. The method further includes forming a first semiconductor region in or on the drift region and electrically coupling the first semiconductor region to a first terminal via a first surface of a semiconductor body. The method further includes etching a trench into the semiconductor body. The method further includes forming a channel region of a second conductivity type in the trench and electrically coupling the channel region to the first terminal via the first surface of the semiconductor body, wherein a first side of the channel region adjoins the first semiconductor region.

Those skilled in the art will recognize additional features and advantages up on reading the following detailed description, and up on viewing the accompanying drawings.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts. The features of the various illustrated embodiments can be combined unless they exclude each other.

Embodiments are depicted in the drawings and are detailed in the description which follows.

DETAILED DESCRIPTION

Figure 1:
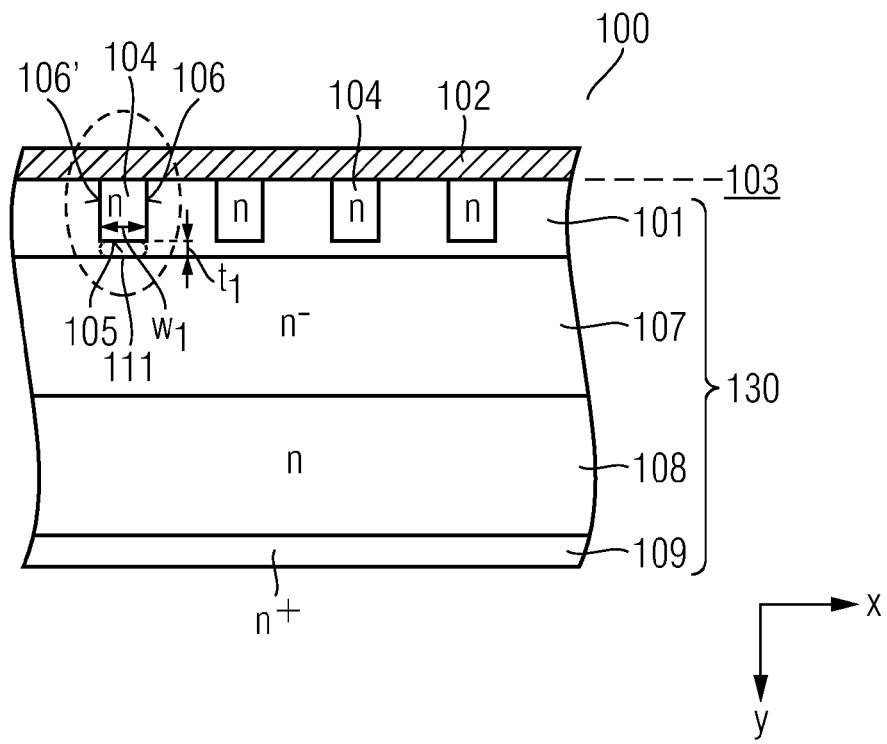
FIG. 1 is a schematic illustration of a vertical cross section through a part of a semiconductor diode including a first contact area electrically coupled to a p-type anode region and to an n-type channel region.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", "over", "above", "below", etc., is used with reference to the orientation of the Figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing processes have been designated by the same references in the different drawings if not stated otherwise.

The terms "lateral" and "horizontal" as used in this specification intends to describe an orientation substantially parallel to a first surface of a semiconductor substrate or semiconductor body. This can be for instance the surface of a wafer or a die.

The term "vertical" as used in this specification intends to describe an orientation which is arranged substantially perpendicular to the first surface of the semiconductor substrate or semiconductor body.

As employed in this specification, the terms "coupled" and/or "electrically coupled" are not meant to mean that the elements must be directly coupled together—intervening elements may be provided between the "coupled" or "electrically coupled" elements.

In this specification, p-type or p-doped may refer to a first conductivity type while n-type or n-doped is referred to a second conductivity type. It goes without saying that the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n$^-$" means a doping concentration less than the doping concentration of an "n"-doping region while an "n$^+$"-doping region has a larger doping concentration than the "n"-doping region. Indicating the relative doping concentration does not, however, mean that doping regions of the same relative doping concentration have the same absolute doping concentration unless otherwise stated. For example, two different n$^+$ regions can have different absolute doping concentrations. The same applies, for example, to an n$^+$ and a p$^+$ region.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

FIG. 1 illustrates a semiconductor diode 100 according to an embodiment. The semiconductor diode 100 includes a p-type anode region 101 electrically coupled to a first contact area 102, e.g. a conductive area such as a metal area, via a first surface 103 of a semiconductor body 130. A lateral direction x extends in parallel to the first surface 103 and a vertical direction y extends perpendicular to the first surface 103.

An n-type channel region 104 is electrically coupled to the first contact area 102. A bottom side 105 of the n-type channel region 104 adjoins the p-type anode region 101. A lateral face 106 of the n-type channel region 104 adjoins the p-type anode region 101. A bottom side of the p-type anode region 101 adjoins a top side of an n$^-$-type drift zone 107. A bottom side of the n$^-$-type drift zone 107 adjoins a top side of an n-type field stop zone 108. A bottom side of the n-type field stop zone 108 adjoins a top side of an n$^+$-type cathode region 109. The n-type field stop zone 108 may be omitted in other embodiments.

In the embodiment illustrated in FIG. 1, the drift zone 107 is of n$^-$-type. According to another embodiment, the drift zone 107 is intrinsic. According to yet another embodiment, the drift zone 107 is of p$^-$-type. A transition between the drift zone 107 and the p-type anode region 101, regardless of whether the drift zone 107 is intrinsic, of n$^-$-type or of p$^-$-type, is located in a depth $y_i$ along the vertical direction y where a p-type impurity profile of the p-type anode region 101 intersects an n-type or p-type profile of the drift zone 107 or where the p-type impurity profile of the p-type anode region 107 adjoins the intrinsic profile of the drift zone 107.

According to one embodiment, a maximum width w1 of the channel region 104 along the lateral direction x satisfies 50 nm<$w_1$<500 nm.

According to another embodiment, a thickness $t_1$ of a part 111 of the p-type anode region 101 between the bottom side 105 of the n-type channel region 104 and a top side of the n$^-$-type drift region 107 is chosen to accumulate a space charge per area in the part 111 that is smaller than a charge to breakdown per area between the anode region 101 and the cathode region 109. As an example the charge to breakdown qbr may satisfy $5\times10^{11}$ cm$^{-2}$<qbr/e<$4\times10^{12}$ cm$^{-2}$, in particular $1\times10^{12}$ cm$^{-2}$<qbr/e<$2\times10^{12}$ cm$^{-2}$.

The n-type channel region 104 provides a current path between the first contact area 102 and the cathode region 109 which is in parallel to a whole current injected from the p-type anode region 101 into the n$^-$-type drift zone 107. In other words, electrons from the n$^-$-type drift zone 107 may be conducted to the first contact area 102 at the first surface 103 via the n-type channel region 104.

An increase in a vertical current flow along the n-type channel region 104 results in an increasing voltage drop along the vertical direction y of the n-type channel region 104. Due to this voltage drop, a space charge region between the n-type channel region 104 and the surrounding p-type anode region 101 builds up. The extension of the space charge region into the n-type channel region 104 is larger in a bottom part of the n-type channel region 104 than in a top part which is due to the decreasing voltage drop in the n-type channel region 104 from the bottom side to the top side. The space charge region laterally extends into the n-type channel region 104 from opposing sidewalls. A distance between the ends of opposing space charge regions extending into one n-type channel region 104 defines a width of the channel which is capable to conduct any electron current from the n$^-$-type drift zone 107 to the first contact area 102. Thus, an increase in the current density between the first contact area 102 and the cathode region 109 relates to a decrease of the channel width to the n-type channel region 104 that is capable to conduct any electron current. As a consequence, more holes are injected from the p-type anode region 101 into the n$^-$-type drift zone 107. In other words, an increase in the current density between anode and cathode leads to an increase in an emitter efficiency of the p-type anode region 101. Thus, at a nominal current density within the device, a comparatively low anode emitter efficiency allows to maintain a beneficial switching characteristic and robustness whereas the comparatively high anode emitter efficiency at high current densities within the device, i.e. a comparatively high charge carrier flooding, allows to improve a surge current capability.

Thus, the excess charge carrier distribution can be adapted to different operation modes within the semiconductor diode so as to improve characteristics such as surge current capability and soft switching behaviour.

Figure 2A:
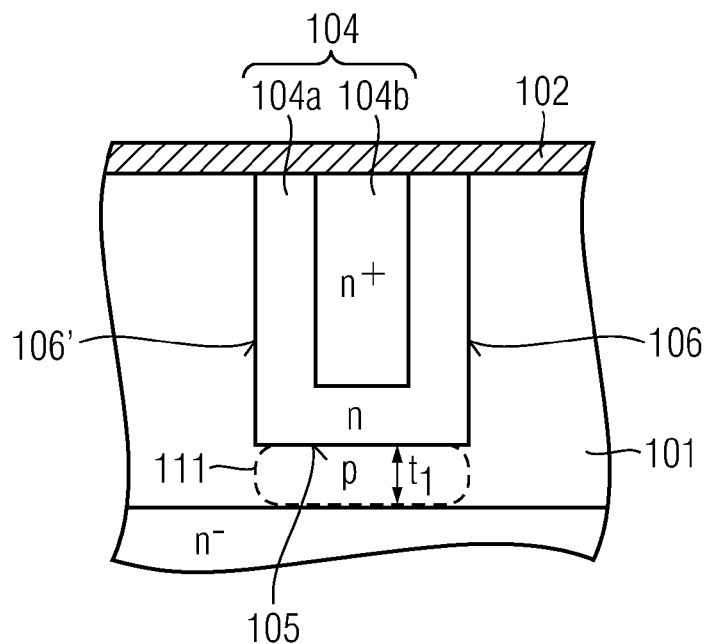
FIGS. 2A through 2C illustrate embodiments of the n-type channel region of FIG. 1.
Figure 2B:
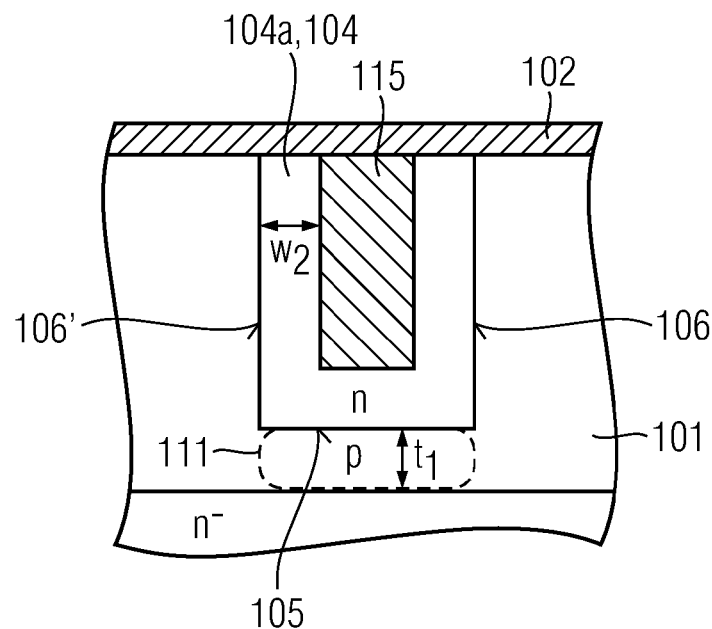
Figure 2C:
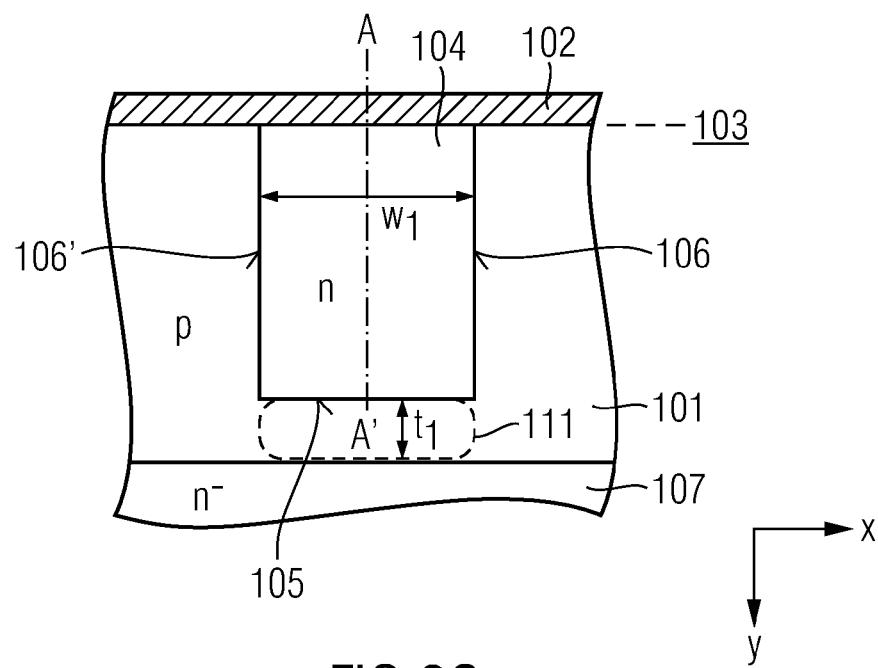

FIGS. 2A through 2C illustrate layouts on the n-type channel region 104 according to embodiments.

Referring to FIG. 2A, the n-type channel region 104 includes an outer n-type layer 104a and inner n$^+$-type layer 104b. The outer n-type layer 104a adjoins the surrounding p-type anode region 101 at a bottom side and at lateral faces of the n-type channel region 104. In the embodiment illustrated in FIG. 2A, during current flow along the channel region 104, a lateral extension of two space charge regions into the n-type channel region 104 from lateral faces 106, 106' is largest at a bottom side of the outer n-type layer 104a. After passing the bottom side of the outer n-type layer 104a, an electrode current from the n$^-$-type drift zone 107 is conducted via low ohmic inner n$^+$-type layer 104b to the first contact area 102, i.e. an anode contact area.

Referring to FIG. 2B, the n-type channel region 104 includes an outer n-type layer 104a adjoining the p-type anode region 101 at a bottom side and at lateral faces. A dielectric layer 115, e.g. an oxide or nitride, is arranged on the outer n-type layer 104a. Thus, the outer n-type layer 104a is sandwiched between the dielectric layer 115 and the p-type anode region 101. The embodiment illustrated in FIG. 2B differs from the embodiment illustrated in FIG. 2A in that a channel conducting electrons from the n$^-$-type drift zone 107 to the first contact region 102 is laterally confined by a space charge region and a dielectric layer 115. In the embodiment illustrated in FIG. 2A, lateral confinement of the channel is achieved by the lateral extension of two opposite space charge regions into the n-type channel region 104. In the embodiment illustrated in FIG. 2B, the n-type channel region 104 and the dielectric layer 115 may be formed within a trench. Since a width of the n-type channel region 104 is smaller than the width of a previously formed, demands on lithographic masks for manufacturing the n-type channel region 104 illustrated in FIG. 2B are lower than in the embodiment illustrated in FIG. 2A. A width $w_2$ of the outer n-type layer 104a may be precisely adjusted by epitaxial growth on lateral faces and on a bottom side of a trench within the p-type anode region 101, for example.

Referring to FIG. 2C, the n-type channel region 104 is one continuous layer including a substantially constant n-type impurity concentration or a profile of n-type impurities decreasing from the first surface 103 along the vertical direction y towards the n$^-$-type drift zone 107, for example.

In each one of the embodiments illustrated in FIGS. 2A to 2C, an n$^+$-type contact region may be formed between the n-type channel region 104 and the first contact region 102 at the first surface 103 to allow for an ohmic contact between the n-type channel region 104 and the first contact area 102 (not illustrated in FIGS. 2A to 2C).

Figure 3:
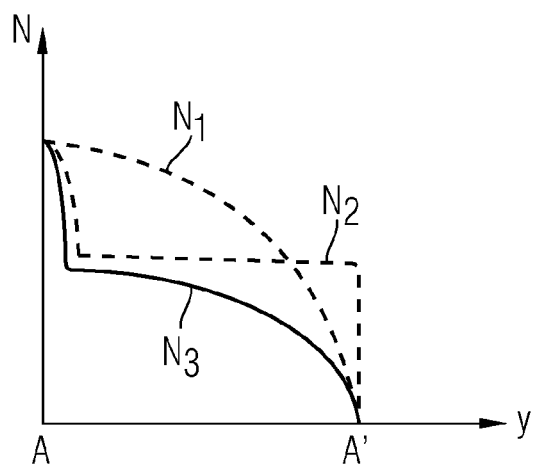
FIG. 3 is a schematic illustration of n-type impurity profiles of the n-type channel region along the line AA' of FIG. 2C.

Referring to FIG. 3, n-type impurity profiles of the n-type channel region 104 are illustrated along the vertical direction y of line AA' of FIG. 2C.

A curve denoted $N_1$ illustrates an n-type impurity profile that decreases along the vertical direction y from the first surface 103 at A to a bottom side of the n-type channel region 104 at A'. The n-type impurity profile $N_1$ may be formed by diffusion or ion implantation of the n-type impurities. A peak concentration of $N_1$ at the first surface 103 at A may be large enough to form an ohmic contact to the first contact area 102. In this case, an additional n$^+$-type contact region may be superfluous.

The curve denoted $N_2$ includes a first profile part adjoining the first surface 103 at A. This first profile part includes a peak concentration of n-type impurities large enough to form an ohmic contact to the first contact area 102 at the first surface 103 at A. The first profile part of $N_2$ may be formed by ion implantation or diffusion of n-type impurities, for example. A second profile part of $N_2$ includes a substantially constant concentration of n-type impurities. The second profile part may be formed by in-situ doping during epitaxial growth of the corresponding part of the n-type channel region 104, for example.

The curve denoted $N_3$ also includes a first profile part at the first surface 103 at A. The first profile part of $N_3$ forms an ohmic contact to the first contact area 102. Further, the curve denoted $N_3$ includes a second profile part including an n-type impurity concentration decreasing along the vertical direction y towards a bottom side of the n-type channel region at A'. The second profile part may be formed by diffusion or ion implantation of the n-type impurities.

Figure 4A:
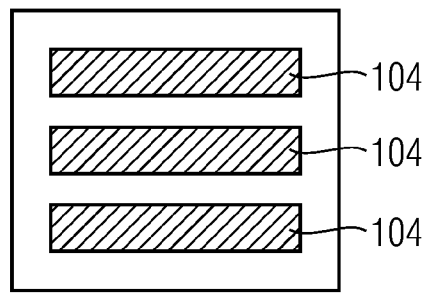
FIGS. 4A through 4C illustrate top views on layouts of the n-type channel region illustrated in FIG. 1.
Figure 4B:
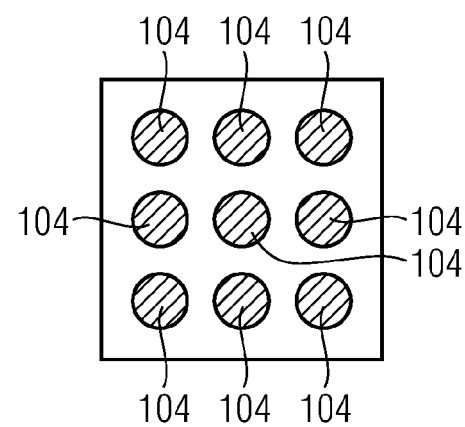
Figure 4C:
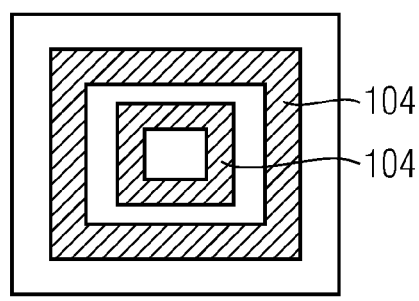

FIGS. 4A through 4C illustrate top views on layouts of the n-type channel region according to embodiments.

Referring to the schematic top view of FIG. 4A, the n-type channel region 104 is in the shape of stripes extending in parallel to each other.

Referring to the schematic top view of FIG. 4B, the n-type channel region 104 is in the shape of circles arranged in a regular pattern.

Referring to FIG. 4C, the n-type channel regions 104 are formed as interlaced closed rectangular-shaped loops.

According to other embodiments, other layouts and/or other regular patterns of the n-type channel region 104 may be used, e.g. interlaced circular loops or e.g. hexagonal patterns, respectively.

Figure 5:
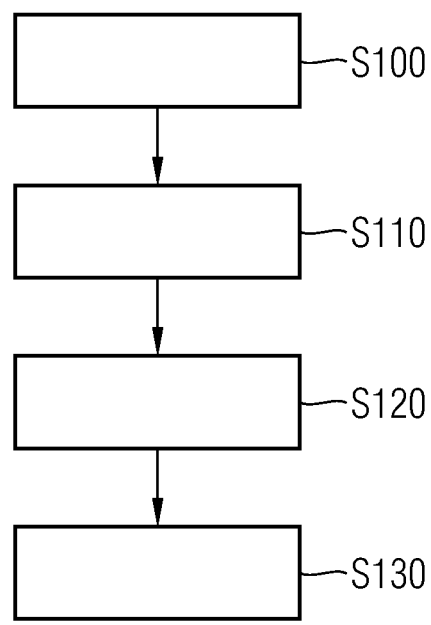
FIG. 5 is a simplified illustration of a method of manufacturing a semiconductor diode according to an embodiment.

FIG. 5 is a simplified illustration of a method of manufacturing a semiconductor diode according to an embodiment.

At S100, a drift region is formed.

At S110, a first semiconductor region is formed in or on the drift region and the first semiconductor region is electrically coupled to a first terminal via a first surface of a semiconductor body.

At S120, a trench is etched into the semiconductor body.

At S130, a channel region of a second conductivity type is formed in the trench and electrically coupled to the first terminal via the first surface of the semiconductor body, wherein a first side of the channel region adjoins the first semiconductor region.

The above features S100, S110, S120 and S130 may be carried out in a sequence different from the sequence described above.

Figure 6A:
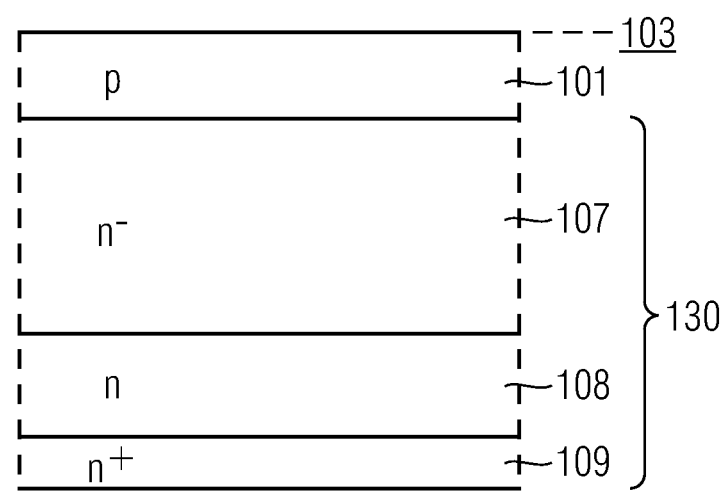
FIGS. 6A through 6C are schematic cross sections through a part of a semiconductor body during one embodiment of manufacturing the semiconductor diode of FIG. 1.
Figure 6B:
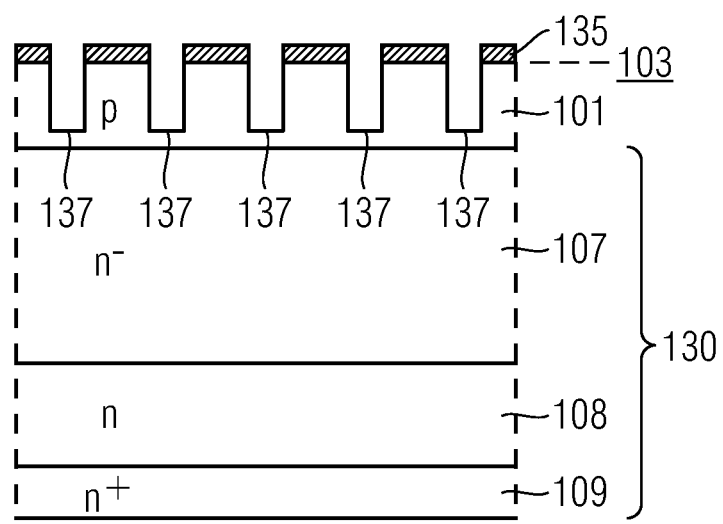
Figure 6C:
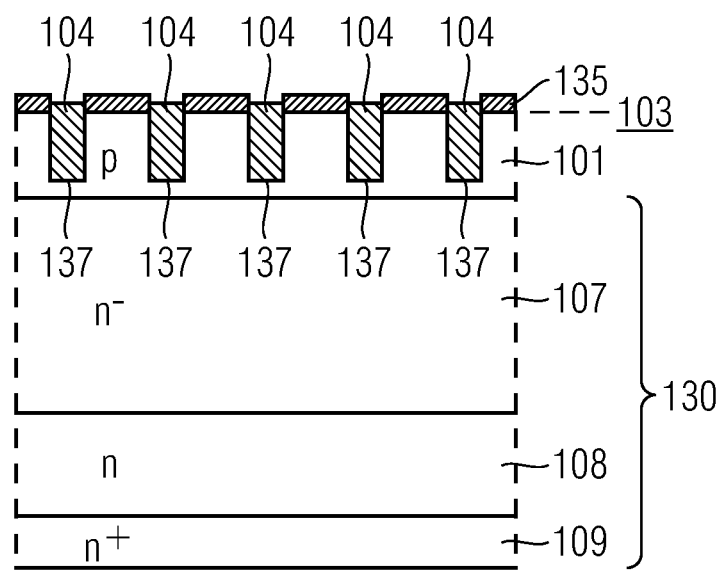

FIGS. 6A through 6C illustrate schematic cross-sectional views of a portion of a semiconductor body during manufacture of a semiconductor diode according to an embodiment.

Referring to FIG. 6A, a p-type anode region 101 is formed on an n$^-$-type drift zone 107 of a semiconductor body 130. The n-type semiconductor body 130 further includes an optional n-type field stop zone 108 and an n$^+$-type cathode region 109.

The p-type anode region 101 may be formed by implanting p-type impurities such as boron into the n-type semiconductor body 130, for example. A thermal anneal may follow or be carried out in a later process sequence.

Referring to FIG. 6B, a mask pattern 135, e.g. a hard mask pattern or a resist mask pattern, is formed on the p-type anode region 101. The mask pattern 135 may be formed by lithography, for example. A material of the mask pattern 135 may be appropriately chosen to act as an etch mask during subsequent etching of trenches into the p-type anode region 101 from the first surface 103. In the embodiment illustrated in FIG. 6B, etching of the trenches 137 is terminated before the trenches 137 penetrate the p-type anode region 101 into the n$^-$-type drift zone 107.

Referring to FIG. 6C, the trenches 137 are filled with an n-type semiconductor layer constituting the n-type channel regions 104. Filling up the trenches 137 may be carried out by epitaxial growth on a bottom side and on side faces of the trenches 137 or by deposition of a material such n⁺-type polysilicon into the trenches 137, for example. An impurity profile of the n-type channel regions 104 may be adjusted by ion implantation using one or several implant doses and/or implant energies and/or types of impurities.

Then, excessive material accumulated on the mask pattern 135 when filling the trenches 137 by deposition of this material is removed.

Optionally an n⁺ contact region may be formed in the top part of the n-type channel regions 104, e.g. using ion implantation through the openings in the mask pattern 135.

Further processes including removing the mask pattern 135 and forming the first contact area 102 illustrated in FIG. 1 follow to complete the semiconductor diode.

Figure 7A:
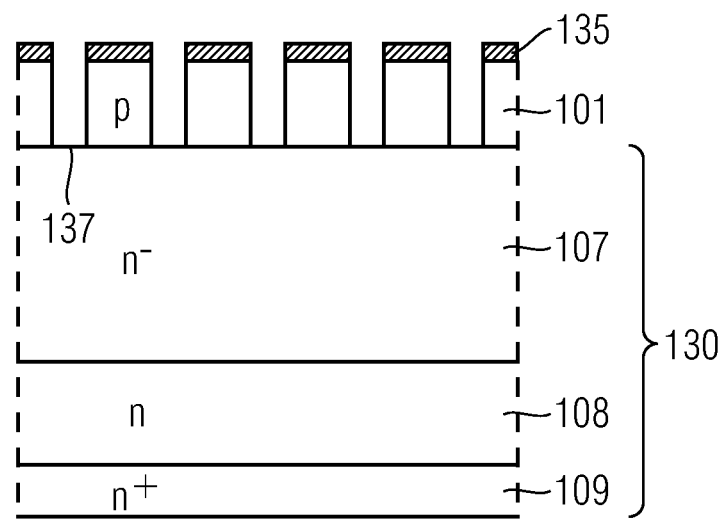
FIGS. 7A and 7B are schematic cross sections through a part of a semiconductor body illustrating embodiments of manufacturing the n-type channel region other than illustrated in FIG. 5B.
Figure 7B:
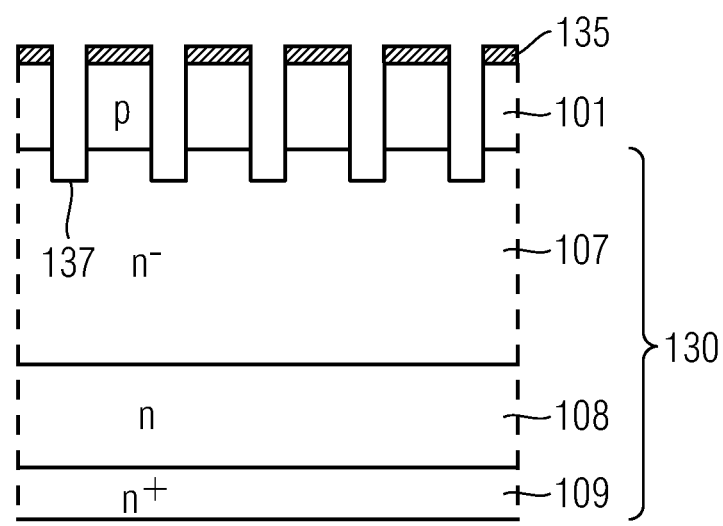

The schematic cross-sectional views of the semiconductor body 130 in FIGS. 7A and 7B illustrate further embodiments of manufacturing the semiconductor diode.

The process illustrated in FIG. 7A differs from the process illustrated in FIG. 6B in that etching of the trenches 137 is terminated before etching the trenches 137 into the drift region. In other words, the trenches 137 are etched into the p-type body region 101 up to a top side of the n⁻-type drift zone 107, i.e. these trenches penetrate the p-type anode region 101 and end on the top side of the n⁻-type drift zone 107.

The process illustrated in FIG. 7B differs from the process illustrated in FIG. 6B in that etching of the trenches 137 is terminated after etching the trenches 137 into the drift region. In other words, the trenches 137 are etched through the p-type body region 101 and into the n⁻-type drift zone 107.

Figure 8:
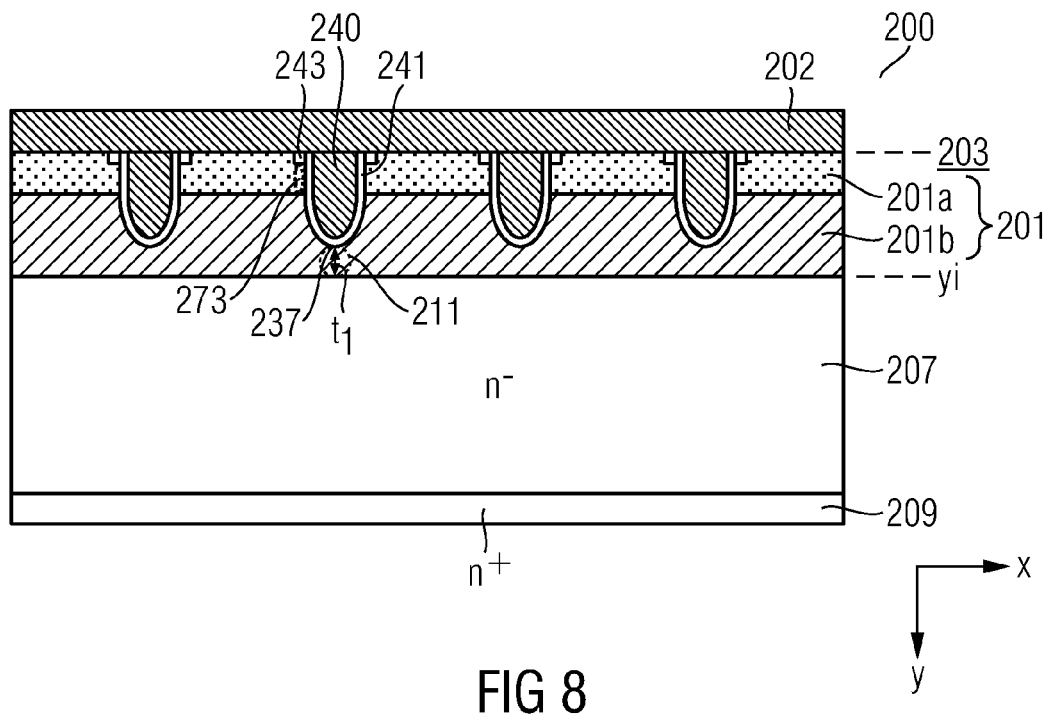
FIG. 8 is a schematic illustration of a vertical cross section through a part of a semiconductor diode including a p-type anode region and a trench including an electrode and a dielectric adjoining the p-type anode region.

FIG. 8 illustrates a semiconductor diode 200 according to an embodiment. The semiconductor diode 200 includes a p-type region 201 electrically coupled to a first contact area 202, e.g. a conductive area such as a metal area, via a first surface 203 of a semiconductor body. The p-type region 201 includes a p-type anode zone 201a adjoining the first contact area 202 and a p-type field stop zone 201b adjoining a bottom side of the p-type anode zone 201a.

The semiconductor diode further includes a trench 237 extending through the p-type anode zone 201a and into the p-type field stop zone 201b. A bottom of the trench adjoins the p-type field stop zone 201b. The trench 237 includes an electrode 240 comprising a conductive material such as a doped semiconductor material, e.g. doped polysilicon, and/or a metal or a combination thereof. The electrode is electrically coupled to the p-type region 201 via the contact area 202. A dielectric layer 241 electrically insulates the electrode 240 and the p-type region 201 at a bottom side and side faces of the trench 237. An n⁺-type source zone 243 adjoins a side face of the dielectric layer 241 of the trench 237 and is electrically coupled to the first contact area 202.

The p-type region 201 adjoins an n⁻-type drift zone 207. The n⁻-type drift zone 207 adjoins an n⁺-type cathode region.

In the embodiment illustrated in FIG. 8, the drift zone 207 is of n⁻-type. According to another embodiment, the drift zone 207 is intrinsic. According to yet another embodiment, the drift zone 207 is of p⁻-type. A transition between the drift zone 107 and the p-type region 201, regardless of whether the drift zone 207 is intrinsic, of n⁻-type or of p⁻-type, is located in a depth $y_i$ along the vertical direction y where a p-type impurity profile of the p-type anode region 201 intersects an n-type or p-type profile of the drift zone 207 or where the p-type impurity profile of the p-type anode region 201 adjoins the intrinsic profile of the drift zone 207.

In the embodiment illustrated in FIG. 1, the channel region 104 allows for an electron current path in parallel to a hole current injection path from the p-type anode region 101. In a similar way, an electron current path builds up in the embodiment illustrated in FIG. 8. When the current density is low enough to allow for hole current injection from the p-type field stop zone 201b into the drift zone 207, i.e. electrons diffuse from the drift zone 207 in the p-type field stop zone 201b to a side face or bottom of the trench 237 and flow along an inversion channel 273 at the side face of the trench 237 to the source zone 243. A conductivity in the inversion channel 273 is controlled via a voltage of the electrode 240 in the trench 237 by field effect. A material of the electrode 240 may be chosen to allow for a threshold voltage of 0V or at around 0V. As an example, a material having a lower work function than n-type polysilicon may be chosen.

A thickness $t_1$ of a part 211 of the p-type field stop zone 201b between a bottom of the trench 237 and a top side of the n⁻-type drift region 207 is chosen to accumulate a space charge per area in the part 211 that is smaller than a charge-to-breakdown per area between the p-type region 201 and the cathode region 209. Hence, at a maximum reverse voltage of the device, an electric field in the space charge region does not reach the bottom of the trench and an increase in a leakage current can be avoided.

At a nominal current density within the device, a comparatively low anode emitter efficiency allows to maintain a beneficial switching characteristic and commutation robustness whereas the comparatively high anode emitter efficiency at high current densities within the device, i.e. a comparatively high charge carrier flooding, allows to improve a surge current capability. A rise in the anode emitter efficiency at high current densities is due to a higher voltage drop along the channel between the drift region 207 and the source region 237. This leads to an increased forward voltage drop across the pn junction between the p-type region 201a and the flooded area leading to an increased flooding of the p-type field stop zone 201b and of the drift region 207 with electrons and holes above a doping level of the p-type field stop zone 201b or drift region 207, respectively. The higher flooding leads to an improved electric conductivity and thus to an improved surge current capability.

Thus, the excess charge carrier distribution can be adapted to different operation modes within the semiconductor diode so as to improve characteristics such as surge current capability and soft switching behaviour.

Figure 9:
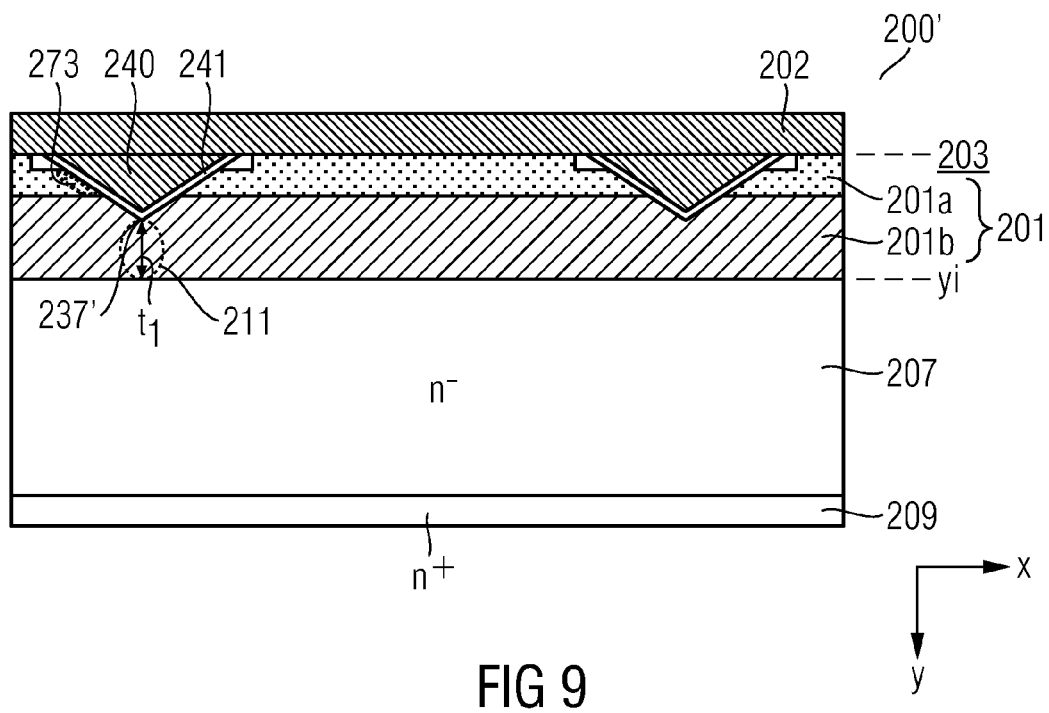
FIG. 9 is a schematic illustration of a vertical cross section through a part of a semiconductor diode including a p-type anode region and a V-shaped trench including an electrode and a dielectric adjoining the p-type anode region.

FIG. 9 illustrates a semiconductor diode 200' that differs from the embodiment illustrated in FIG. 8 by the shape of the trench 237'. In FIG. 9, the trench 237' is V-shaped. A V-shaped trench may be formed by anisotropic etching using an alkaline etch solution, for example. According to yet another embodiment, the trenches may be in the shape of a trapezoid.

Figure 10:
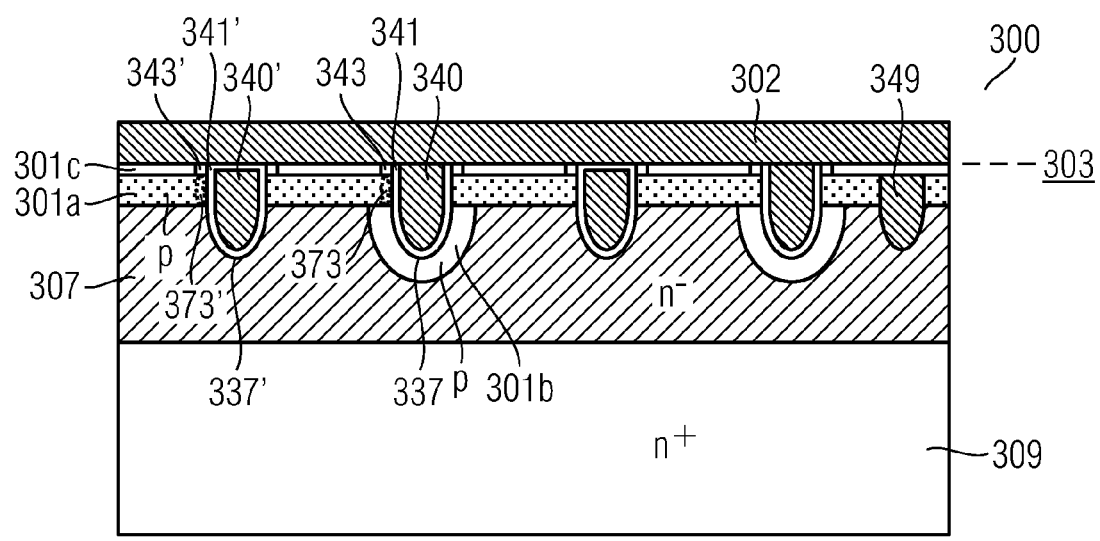
FIG. 10 is a schematic illustration of a vertical cross section through a part of an n-type channel FET including a trench and a p-type region encompassing a bottom part of the trench.

FIG. 10 illustrates a FET 300 according to an embodiment. The FET 300 includes a p-type body region 301a electrically coupled to a first contact area 302, e.g. a conductive area such as a metal area, via a p⁺-type contact region 301c at a first surface 303 of a semiconductor body 330.

The p-type body region 301a adjoins an n⁻-type drift zone 307. The n⁻-type drift zone 307 adjoins an n⁺-type region 309 such as an n⁺-type substrate.

The FET 300 further includes a first trench 337 extending through the p-type body region 301a and into the drift zone 307. A part of the first trench 337 that extends into the drift zone 307 is encompassed by a p-type field stop zone 301b. The first trench 337 includes a first electrode 340 comprising a conductive material such as a doped semiconductor material, e.g. doped polysilicon, and/or a metal or a combination thereof. A conductivity in an inversion channel 373 is controlled via a voltage of the first electrode 340 in the first trench 337 by field effect. The first electrode 340 is electrically coupled to the p-type body region 301a via the first contact area 302 above the first surface 303. A first dielectric layer 341 electrically insulates the first electrode 340 from the p-type body region 301a and the p-type field stop zone 301b below the first surface 303. A first n$^+$-type source zone 343 adjoins a side face of the first dielectric layer 341 of the first trench 337 and is electrically coupled to the first contact area 302.

The FET 300 further includes a second trench 337' extending through the p-type body region 301a and into the drift zone 307. The second trench 337' includes a second electrode 340' comprising a conductive material such as a doped semiconductor material, e.g. doped polysilicon, and/or a metal or a combination thereof. A second dielectric layer 341' electrically insulates the first electrode 340 from the p-type body region 301a, the drift zone 307 and the first contact area 302. A conductivity in an inversion channel 373' is controlled via a voltage of the second electrode 340' in the second trench 337' by field effect. A second n$^+$-type source zone 343' adjoins a side face of the second dielectric layer 341' of the second trench 337' and is electrically coupled to the first contact area 302.

In the embodiment of FIG. 10, active FET cells include the second trench 337' and diode cells include the first trench 337. In the diode cells, the excess charge carrier distribution can be adapted to different operation modes within the diode cells so as to improve characteristics such as surge current capability and soft switching behaviour.

In the embodiments described above, the electrodes 140, 240, 340 in the trenches 137, 237, 337 are in direct contact with the contact area 102, 202, 302 on top of the electrodes 140, 240, 340. According to other embodiments, dielectric layers remain on at least part of a top side of the electrodes 140, 240, 340 and the electrodes 140, 240, 340 are electrically coupled to the contact area 102, 202, 302 in another way such as via contact openings in the dielectric layers, for example.

According to an embodiment, the FET 300 includes a p-type clamping region 349 extending from the first surface 303 into the semiconductor body 330. A bottom of the p-type clamping region 349 may be above a bottom of the first and/or second trench 337, 337'. These p-type clamping regions support an electrical breakdown. When commutating the diode cells and body diodes of the FET cells, a hole current during sweeping the charge carriers out of the diode flows via the p-type clamping region 349. A plurality of p-type clamping regions 349 may be arranged in a pattern over a cell area of the FET 300. The p-type clamping regions 349 may also be provided in the diodes illustrated in FIGS. 1, 8 and 9.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, comprising:
    forming a semiconductor diode, including:
        forming a drift region;
        forming a first semiconductor region of a first conductivity type in or on the drift region and electrically coupling the first semiconductor region to a first terminal via a first surface of a semiconductor body;
        etching a trench into the semiconductor body; and
        forming a channel region of a second conductivity type in the trench and electrically coupling the channel region to the first terminal via the first surface of the semiconductor body, wherein a first side of the channel region adjoins the first semiconductor region.

2. The method of claim 1, wherein forming the channel region comprises forming a silicon layer on side walls and on a bottom side of the trench by selective epitaxial growth on the semiconductor body made of silicon.

3. The method of claim 2, further comprising forming a polysilicon layer on the silicon layer in the trench.

4. The method of claim 2, further comprising forming a dielectric layer on the silicon layer in the trench.

5. The method of claim 1, wherein forming the channel region comprises implanting dopants into the n-type channel region.

6. The method of claim 1, wherein etching of the trench is terminated before etching the trench into the drift region.

7. The method of claim 1, wherein etching of the trench is terminated after etching the trench into the drift region.

8. The method of claim 1, wherein a bottom of the channel region adjoins the first semiconductor region.

9. The method of claim 8, wherein the first side and the bottom of the channel region are embedded in the first semiconductor region.

* * * * *